(12) United States Patent
Congdon

(10) Patent No.: US 6,958,623 B2
(45) Date of Patent: Oct. 25, 2005

(54) THREE TERMINAL NONINVERTING TRANSISTOR SWITCH

(76) Inventor: James S. Congdon, 55 Oakwood Ave., Sudbury, MA (US) 01776

( * ) Notice: Subject to any disclaimer, the term of this patent is extended or adjusted under 35 U.S.C. 154(b) by 0 days.

(21) Appl. No.: 10/466,789
(22) PCT Filed: Jan. 18, 2002
(86) PCT No.: PCT/US02/01352
§ 371 (c)(1),
(2), (4) Date: Jan. 7, 2004
(87) PCT Pub. No.: WO02/058218
PCT Pub. Date: Jul. 25, 2002

(65) Prior Publication Data
US 2004/0100303 A1 May 27, 2004

Related U.S. Application Data
(60) Provisional application No. 60/262,755, filed on Jan. 19, 2001.

(51) Int. Cl.[7] .............................................. H03K 17/16
(52) U.S. Cl. ........................... 326/24; 326/81; 326/119; 326/121; 327/206; 327/427
(58) Field of Search .................. 326/81, 108, 119–121; 327/206, 427, 430, 432, 483

(56) References Cited

U.S. PATENT DOCUMENTS 5,594,361 A * 1/1997 Campbell ..................... 326/24
6,259,292 B1 * 7/2001 Congdon .................... 327/206
6,639,777 B1 * 10/2003 Congdon ...................... 361/94

* cited by examiner

Primary Examiner—Vibol Tan
(74) Attorney, Agent, or Firm—Kriegsman & Kriegsman

(57) ABSTRACT

A noninverting transistor switch having only a first terminal, a second terminal and a third terminal includes a transistor connected to the second and third terminals, the transistor having an on switching state in which current is able to pass between the second and third terminals and an off switching state in which current is interrupted from passing between the second and third terminals. The transistor switch also includes a voltage stabilizer connected to the second and third terminals. The transistor switch further includes a CMOS inverter connected to the first terminal, the second terminal, the transistor and the voltage stabilizer. In use, the CMOS inverter interrupts the passing of current between the voltage stabilizer and the second terminal when the transistor is in its off switching state.

19 Claims, 7 Drawing Sheets

THREE TERMINAL NONINVERTING TRANSISTOR SWITCH

CROSS-REFERENCE TO RELATED APPLICATIONS

The present application claims the benefit under 35 U.S.C. 119(e) of U.S. Provisional Patent Application Ser. No. 60/262,755, filed Jan. 19, 2001, the disclosure of which is incorporated herein by reference.

BACKGROUND OF THE INVENTION

The present invention relates generally to transistor switches and more particularly to three terminal, noninverting transistor switches.

Transistor switches, or transistors, are well known in the art and are commonly used in commerce. Transistors are solid-state electronic devices which are capable of amplification and switching.

A noninverting transistor switch is one type of transistor switch which is well known in the art and which is commonly used in a variety of different applications.

As an example of one potential application, a noninverting transistor switch is commonly used as a discharge switch for a power supply circuit. Specifically, the noninverting transistor switch serves to dissipate excess voltage (e.g., resulting from a power surge) which is present in the power supply circuit. As can be appreciated, failure to properly dissipate excess voltage can potentially damage a power supply circuit.

As an example of another potential application, a noninverting transistor switch is commonly used as a supervisory switch for monitoring power supplies in microprocessor and digital systems. In use, the noninverting transistor switch serves to monitor the voltage level of the power supplies and to assert a reset signal when the power supplies decline below a preset threshold.

Noninverting transistor switches typically comprise at least four terminals, one terminal being connected to an input signal, another terminal being connected to a load, another terminal being connected to ground and the last terminal being connected to a power supply in order to provide a "second" inversion for the switch.

Noninverting transistor switches which comprise only three terminals are well known and widely used in the art. Noninverting transistor switches which comprise only three terminals include a first terminal connected to an input signal, a second terminal connected to ground and a third terminal connected to a load. Noninverting transistor switches which comprise only three terminals do not require a fourth terminal connected to a power supply, thereby rendering noninverting transistor switches which comprise only three terminals more desirable than noninverting transistor switches which comprise at least four terminals.

In U.S. Pat. No. 5,134,323 to J. S. Congdon, there is disclosed a noninverting transistor switch having only three terminals, the three terminals being identified as a first terminal, a second terminal and a third terminal. The switch comprises first, second and third transistors. The first transistor includes base, emitter and collector electrodes, the base electrode being coupled to the first terminal. The second transistor includes drain, gate and source electrodes, the drain electrode being coupled to the third terminal. The third transistor includes base, emitter and collector electrodes, the emitter electrode being connected to the second terminal and the collector electrode being connected to the third terminal. The collector electrode of the first transistor is coupled to the source electrode of the second transistor and the base electrode of the third transistor. The gate electrode of the second transistor and the emitter electrode of the third transistor are coupled to the emitter electrode of the first transistor. In use, switching for the noninverting transistor switch takes place between the collector electrode and the emitter electrode of the third transistor, the collector electrode of the third transistor being connected to the third terminal of the switch and the emitter electrode of the third transistor being connected to the second terminal of the switch.

Although well known and widely used in commerce, the three terminal noninverting transistor switch which is described above and which is disclosed in U.S. Pat. No. 5,134,323 to J. S. Congdon suffers from a notable drawback. Specifically, it has been found that, upon the application of a high input signal voltage to the first terminal, the current leakage between the third terminal and the second terminal is significantly higher than zero, which is highly undesirable. In fact, it has been found that, upon the application of a high input signal voltage to the first terminal, the current leakage between the third terminal and the second terminal is approximately the IDSS value of the second transistor (the second transistor preferably being in the form of an EPI FET or channel resistor), which is highly undesirable in certain applications.

SUMMARY OF THE INVENTION

It is an object of the present invention to provide a new and improved transistor switch.

It is another object of the present invention to provide a transistor switch that is noninverting.

It is yet another object of the present invention to provide a transistor switch as described above which contains only three terminals.

It is still another object of the present invention to provide a transistor switch as described above which comprises a first terminal connected to an input signal, a second terminal connected to ground and a third terminal connected to a load.

It is yet still another object of the present invention to provide a transistor switch as described above which limits the current leakage between the third terminal and the second terminal upon the application of a logic high input signal to the first terminal.

It is another object of the present invention to provide a transistor switch as described above which experiences hysteresis.

It is yet another object of the present invention to provide a transistor switch as described above which can be mass produced, has a minimal number of parts, is limited in size, operates quickly, is reliable, requires a limited amount of input power and can be very easily used.

Accordingly, there is provided a noninverting transistor switch having only three terminals, said three terminals being a first terminal, a second terminal and a third terminal, said noninverting transistor switch comprising a transistor switch connected to the second and third terminals, said transistor switch having an on switching state in which current is able to pass between the second and third terminals and an off switching state in which current is interrupted from passing between the second and third terminals, a voltage regulator connected to the second and third terminals, and a complementary metal oxide semiconductor (CMOS) inverter connected to the first terminal, the second terminal, said transistor switch and said voltage regulator, said CMOS inverter interrupting the passing of current between said voltage regulator and the second terminal when said transistor switch is in its off switching state.

Additional objects, as well as features and advantages, of the present invention will be set forth in part in the description which follows, and in part will be obvious from the description or may be learned by practice of the invention. In the description, reference is made to the accompanying drawings which form a part thereof and in which is shown by way of illustration particular embodiments for practicing the invention. The embodiments will be described in sufficient detail to enable those skilled in the art to practice the invention, and it is to be understood that other embodiments may be utilized and that structural changes may be,made without departing from the scope of the invention. The following detailed description is, therefore, not to be taken in a limiting sense, and the scope of the present invention is best defined by the appended claims.

BRIEF DESCRIPTION OF THE DRAWINGS

The accompanying drawings, which are hereby incorporated into and constitute a part of this specification, illustrate particular embodiments of the invention and, together with the description, serve to explain the principles of the invention. In the drawings wherein like reference numerals represent like parts.

DETAILED DESCRIPTION OF A PREFERRED EMBODIMENT

Figure 1:
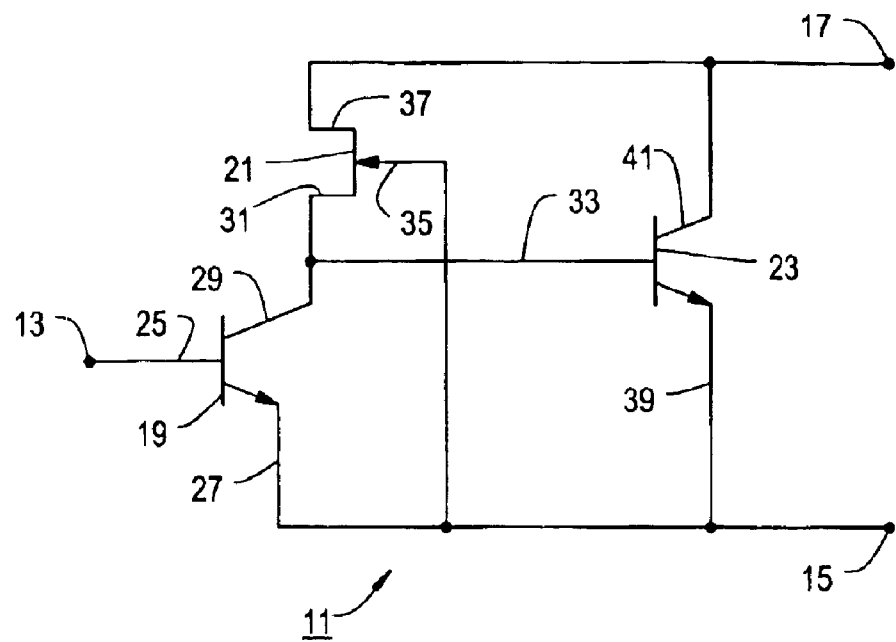
FIG. 1 is a schematic representation of a prior art three terminal, noninverting transistor switch.

Referring now to FIG. 1, there is shown a prior art three terminal, noninverting transistor switch which is identified generally by reference numeral 11. Switch 11 is of the type described in U.S. Pat. No. 5,134,323 to J. Congdon which is incorporated herein by reference.

Switch 11 includes a first terminal 13, a second terminal 15 and a third terminal 17. Switch 11 further includes an NPN bipolar transistor 19, an N-channel, depletion-mode junction field effect transistor (JFET) 21, and an NPN bipolar transistor 23.

First terminal 13, which serves as the input terminal for switch 11, connects to the base 25 of transistor 19. The emitter 27 of transistor 19 connects to second terminal 15. The collector 29 of transistor 19 connects to the source 31 of JFET 21 and to the base 33 of transistor 23. The gate 35 of JFET 21 connects to second terminal 15. The drain 37 of JFET 21 connects to third terminal 17. The emitter 39 of transistor 23 connects to second terminal 15. The collector 41 of transistor 23 connects to third terminal 17.

In use, prior art switch 11 functions as a three terminal, noninverting switch in the following manner. The application of a low input signal voltage (i.e., any voltage less than the threshold voltage of transistor 19) to first terminal 13 will result in low conductance between collector 29 and emitter 27. JFET 21 conducts between drain 37 and source 31, with the entire current from source 31 passing to base 33 of transistor 23. The passing of current to base 33, in turn, causes transistor 23 to have high conductance between collector 41 and emitter 39. Consequently, high conductivity will exist between third terminal 17 and second terminal 15 upon the application of a low input signal voltage to first terminal 13, thereby producing a low output signal voltage at third terminal 17.

The application of a high input signal voltage (i.e., any voltage greater than the threshold voltage of transistor 19) to first terminal 13 will result in high conductance between collector 29 and emitter 27. JFET 21 conducts between drain 37 and source 31, with current from source 31 being shunted to second terminal 15 via collector 29 and emitter 27 of transistor 19. The shunting of the current from source 31 to second terminal 15 results in the application of a voltage to base 33 which is less than the threshold voltage of transistor 23 which, in turn, causes transistor 23 to have low conductance between collector 41 and 39. Consequently, low conductivity will exist between third terminal 17 and second terminal 15 upon the application of a high input signal voltage to first terminal 13, thereby producing a high output signal voltage at third terminal 17.

Although well-known and widely used in commerce, prior art switch 11 suffers from one notable drawback. Specifically, as noted above, the application of a high input signal voltage to first terminal 13 should result in low conductivity between third terminal 17 and second terminal 15. However, it has been found that, upon the application of a high input signal voltage to first terminal 13, the current leakage between third terminal 17 and second terminal 15 is significantly higher than zero, which is highly undesirable. In fact, it has been found that, upon the application of a high input signal voltage to first terminal 13, the current leakage between third terminal 17 and second terminal 15 is approximately the IDSS value of JFET 21 (which can reach in the order of tens or hundreds of microamps) which, in turn, has found to be unacceptable in certain applications (e.g., microprocessor reset circuitry).

Figure 2:
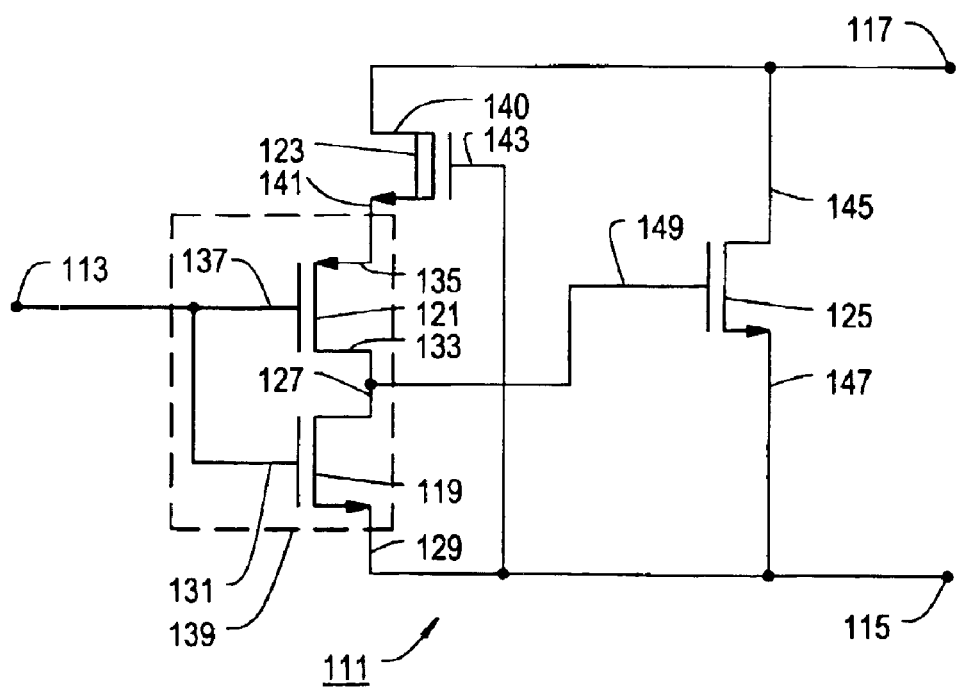
FIG. 2 is a schematic representation of a first embodiment of a three terminal, noninverting transistor switch constructed according to the teachings of the present invention.

Accordingly, referring now to FIG. 2, there is shown a first embodiment of a three terminal noninverting transistor switch constructed according to the teachings of the present invention, the switch being represented generally by reference numeral 111.

Switch 111 is similar in construction to prior art switch 11 in that switch 111 comprises only three terminals. Specifically, switch 111 comprises a first terminal 113, a second terminal 115 and a third terminal 117. As described herein, first terminal 113 serves as the input node for switch 111, second terminal 115 serves as the ground node for switch 111 and third terminal 117 serves as the output node for switch 111. However, it is to be understood that many useful configurations exist for switch 111 in which nodes 113, 115 and 117 would not serve as the input, ground and output nodes, respectively, for switch 111.

As will be described further in detail below, switch 111 functions in a similar manner to prior art switch 11 with one notable exception. Specifically, as noted above, switch 11 experiences a considerable amount of current leakage (in the range between tens or hundreds of microamps and nanoamps) between third terminal 17 and second terminal 15 upon the application of a high input signal voltage to first terminal 13, which is highly undesirable in certain applications. By comparison, switch 111 experiences a considerably smaller amount of current leakage (in the order of nanoamps, picoamps or less) between third terminal 117 and second terminal 115 upon the application of a high input signal voltage to first terminal 113, which is a principal feature of the present invention.

Switch 111 comprises an N-channel, enhancement-mode, metal oxide semiconductor field effect transistor (MOSFET) 119, a P-channel, enhancement-mode, metal oxide semiconductor field effect transistor (MOSFET) 121, an N-channel depletion-mode, metal oxide semiconductor field effect transistor (MOSFET) 123 and an N-channel, enhancement mode, metal oxide semiconductor field effect transistor (MOSFET) 125.

MOSFET 119 includes a drain 127, a source 129 connected to second terminal 115 and a gate 131 connected to first terminal 113. It should be noted that transistor 119 is not limited to being in the form of an N-channel, enhancement-mode, metal oxide semiconductor field effect transistor (MOSFET). Rather, it is to be understood that transistor 119 could be in the form of alternative types of similar devices (e.g., an NPN bipolar transistor) without departing from the spirit of the present invention.

MOSFET 121 includes a drain 133 connected to the drain 127 of MOSFET 119, a source 135 and a gate 137 connected to first terminal 113. It should be noted that transistor 121 is not limited to being in the form of a P-channel, enhancement-mode, metal oxide semiconductor field effect transistor (MOSFET). Rather, it is to be understood that transistor 121 could be in the form of alternative types of similar devices (e.g., a PNP bipolar transistor) without departing from the spirit of the present invention.

Together, MOSFET 119 and MOSFET 121 form a complementary metal oxide semiconductor (CMOS) inverter 139 which can be fabricated using conventional CMOS fabrication technology. However, it is to be understood that CMOS inverter 139 differs from a conventional CMOS inverter in that CMOS inverter 139 is connected to the remainder of the circuit in a nontraditional manner. Specifically, a conventional CMOS inverter is connected to a pair of complementary supply voltages, with the source of the P-channel MOSFET connected to a positive supply voltage (+V) and the source of the N-channel MOSFET connected to ground. To the contrary, CMOS inverter 139 is not connected to a pair of complementary supply voltages. Rather, instead of being connected to a positive supply voltage, source 135 of P-channel MOSFET 121 is connected to source 141 of N-channel MOSFET 123, the drain 140 of MOSFET 121 being connected to third terminal 117.

It should be noted that CMOS inverter 139 is not limited to the particular arrangement of components as shown in FIG. 2. Rather, it is to be understood that CMOS inverter 139 represents any conventional CMOS inverter which is well known in the art. Accordingly, the particular CMOS inverter shown in switch 111 could be replaced by any other well known type of CMOS inverter without departing from the spirit of the present invention.

MOSFET 123 includes a drain 140 connected to third terminal 117, a source 141 connected to the source 135 of MOSFET 121 and a gate 143 connected to second terminal 115. It should be noted that transistor 123 is not limited to being in the form of a N-channel, depletion-mode, metal oxide semiconductor field effect transistor (MOSFET). Rather, it is to be understood that transistor 123 could be in the form of alternative types of similar devices (e.g., an N-channel, depletion-mode junction field effect transistor (JFET)) without departing from the spirit of the present invention.

MOSFET 123 functions as a voltage stabilizer for switch 111. In fact, MOSFET 123 is a low input current voltage stabilizer which is dedicated primarily to supply the voltage which is passed from third terminal 117 to CMOS inverter 139, as will be described further in detail below. As a result, it should be noted that MOSFET 123 could be replaced by alternative types of conventional voltage stabilizers which are well known in the art without departing from the spirit of the present invention.

MOSFET 125 includes a drain 145 connected to third terminal 117, a source 147 connected to second terminal 115 and a gate 149 connected to the drain 127 of MOSFET 119 and to the drain 133 of MOSFET 121. It should be noted that MOSFET 125 is not limited to being in the form of a N-channel, enhancement-mode, metal oxide semiconductor field effect transistor (MOSFET). Rather, it is to be understood that MOSFET 125 could be in the form of alternative types of similar devices (e.g., an NPN bipolar transistor) without departing from the spirit of the present invention.

It should be noted that MOSFET 125 functions as the primary switching device for switch 111. Specifically, MOSFET 125 has an on switching state in which current is able to pass between second terminal 115 and third terminal 117 and an off switching state in which current is interrupted from passing between second terminal 115 and third terminal 117, as will be described further in detail below. As such, it should be noted that MOSFET 125 could be replaced by alternative types of conventional switching devices which are well known in the art without departing from the spirit of the present invention.

In use, switch 111 functions as a three terminal, noninverting switch in the following manner. The application of a low input signal voltage (i.e., any voltage less than the threshold voltage of MOSFET 119 with respect to ground and the threshold voltage of MOSFET 121 with respect to ground, the threshold voltage of MOSFET 121 with respect to ground being the difference between the absolute value threshold of MOSFET 123 and the absolute value threshold of MOSFET 121) to first terminal 113 will result in low conductance between drain 127 and source 129 (i.e., turning MOSFET 119 off) and high conductance between drain 133 and source 135 (i.e., turning MOSFET 121 on). Further, MOSFET 123 conducts between drain 140 and source 141, with the current from source 141 passing entirely through MOSFET 121 and into gate 149 of MOSFET 125. The passing of current into gate 149, in turn, results in the high conductance between drain 145 and source 147 of MOSFET 125. Consequently, high conductivity will exist between third terminal 117 and second terminal 115 (i.e., turning MOSFET 125 on) upon the application of a low input signal voltage to first terminal 113, thereby producing a low output signal voltage at third terminal 117.

The application of a high input signal voltage (i.e., any voltage greater than the threshold voltage of MOSFET 119 with respect to ground and MOSFET 121 with respect to ground) to first terminal 113 will result in high conductance between drain 127 and source 129 (i.e., turning MOSFET 119 on) and low conductance between drain 133 and source 135 (i.e., turning MOSFET 121 off). Further, MOSFET 123 conducts between drain 140 and source 141. The voltage at source 141 rises to as high as the approximate pinch off voltage of MOSFET 123 at which point current ceases to flow through MOSFET 123. The shunting of the current from source 141 to second terminal 115 results in the application of a voltage to gate 149 which is less than the threshold voltage of MOSFET 125. Consequently, low conductivity will exist between third terminal 117 and second terminal 115 (i.e., turning MOSFET 125 off) upon the application of a high input signal voltage to first terminal 113, thereby producing a high output signal voltage at third terminal 117.

Switch 111 functions in a more advantageous manner than prior art switch 11 in that switch 111 experiences a significantly lower amount of current leakage between its second and third terminals than prior art switch 11. Specifically, upon the application of a high input signal voltage to first terminal 113, the amount of current leakage between third terminal 117 and second terminal 115 approaches zero (the current leakage falling within or beneath the range of nanoamps and picoamps), which is a principal object of the present invention. In particular, upon the application of a high input signal voltage to first terminal 113, MOSFET 121 experiences low conductance between drain 133 and source 135 and MOSFET 125 experiences low conductance between drain 145 and source 147. With MOSFETs 121 and 125 both turned off, the amount of current leakage which occurs between third terminal 117 and second terminal 115 is significantly reduced, which is highly desirable.

Switch 111 can be used to improve the performance of many types of conventional transistor switches, which is highly desirable. As an example, switch 111 can be used to decrease the current drain experienced by timer circuits (e.g., of the type described in co-pending U.S. patent application Ser. No. 10/012,184 which was filed on Oct. 30, 2001 in the name of James S. Congdon). As another example, switch 111 can be used to improve the start-up current level experienced by conventional transistor switches.

It should be noted that slight modifications could be made to switch 111 without departing from the spirit of the present invention.

Figure 3:
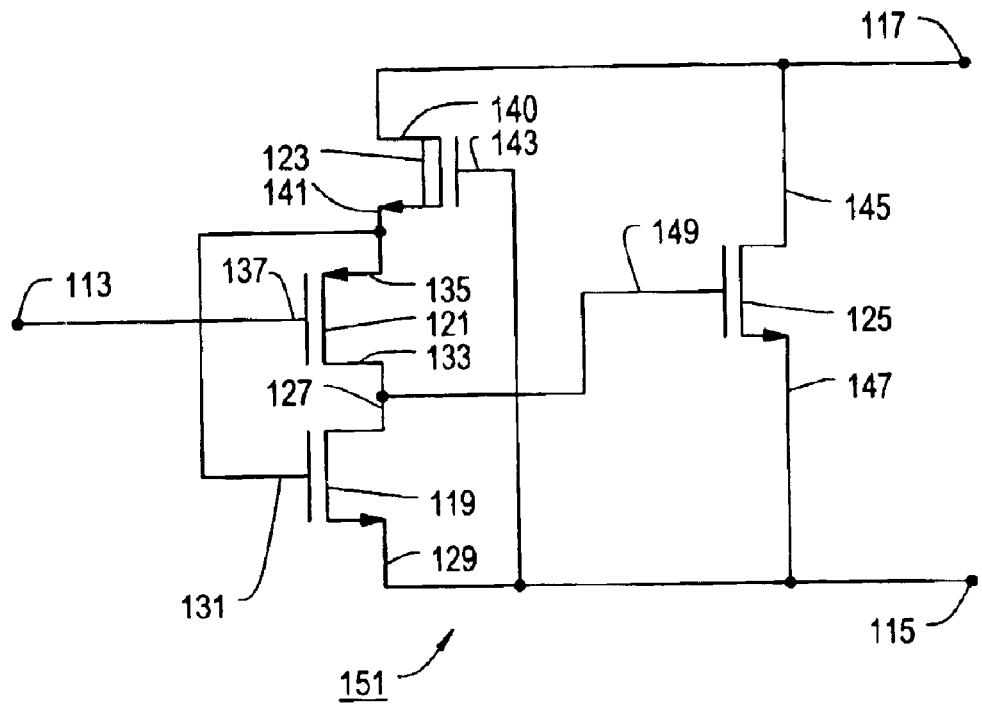
FIG. 3 is a schematic representation of a second embodiment of a three terminal, noninverting transistor switch constructed according to the teachings of the present invention.

As an example, referring now to FIG. 3, there is shown a second embodiment of a three terminal noninverting transistor switch constructed according to the teachings of the present invention, the switch being represented generally by reference numeral 151. Switch 151 is identical to switch 111 in all respects with one notable exception. Specifically, in switch 151, the gate 131 of MOSFET 119 is connected to the source 141 of MOSFET 123 whereas, in switch 111, the gate 131 of MOSFET 119 is connected to the gate 137 of MOSFET 121.

Figure 4:
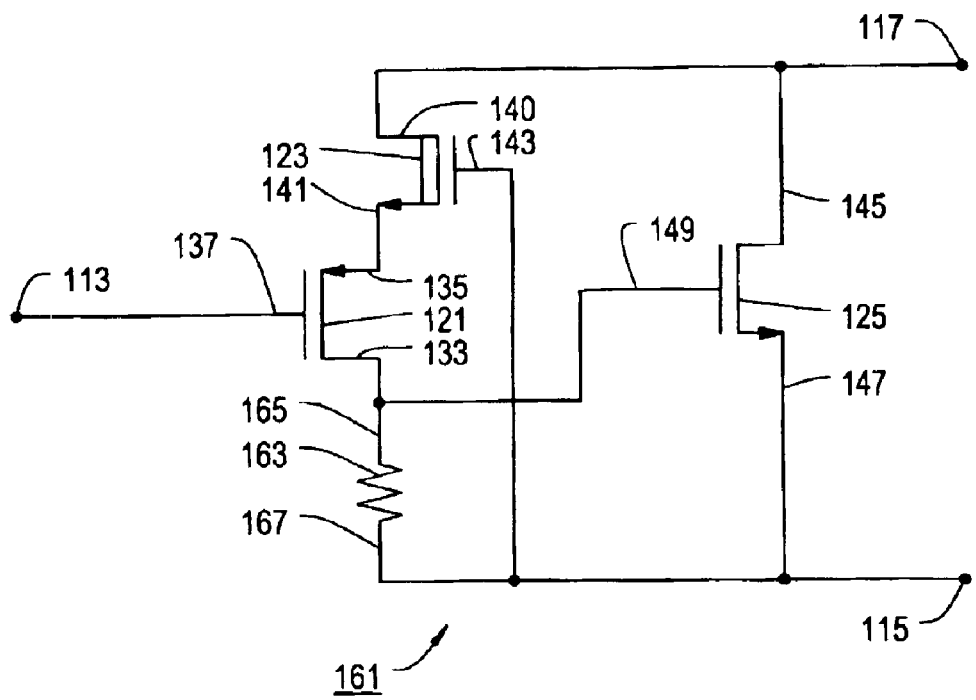
FIG. 4 is a schematic representation of a third embodiment of a three terminal, noninverting transistor switch constructed according to the teachings of the present invention.

As another example, referring now to FIG. 4, there is shown a third embodiment of a three terminal noninverting transistor switch constructed according to the teachings of the present invention, the switch being represented generally by reference numeral 161. Switch 161 is identical to switch 111 in all respects with one notable exception. Specifically, MOSFET 119 in switch 111 is replaced with a load resistor 163 in switch 161, load resistor 163 having a first terminal 165 connected to the drain 133 of MOSFET 121 and a second terminal 167 connected to second terminal 115.

Although highly useful, switch 111 suffers from one notable drawback. Specifically, switch 111 does not experience hysteresis. As a result, a noisy input signal which approaches the threshold voltage for MOSFETs 119 and 121 can potentially cause MOSFET 125 to experience unwanted state changes or even to remain in between an on switching state and an off switching state, this in-between condition being prone to oscillation and high power dissipation.

Accordingly, switching devices which experience hysteresis are desirable. Hysteretic switching devices reduce the problem of a noisy input signal causing the primary switching device to experience unwanted state conditions by using two different threshold voltages. Specifically, switching devices which experience hysteresis typically use a high threshold voltage, commonly referred to as the rising or positive threshold voltage, to switch the primary switching device during low-to-high input signal transitions and a lower threshold voltage, commonly referred to as the falling or negative threshold voltage, to switch the primary switching device during high-to-low input signal transitions.

Figure 5:
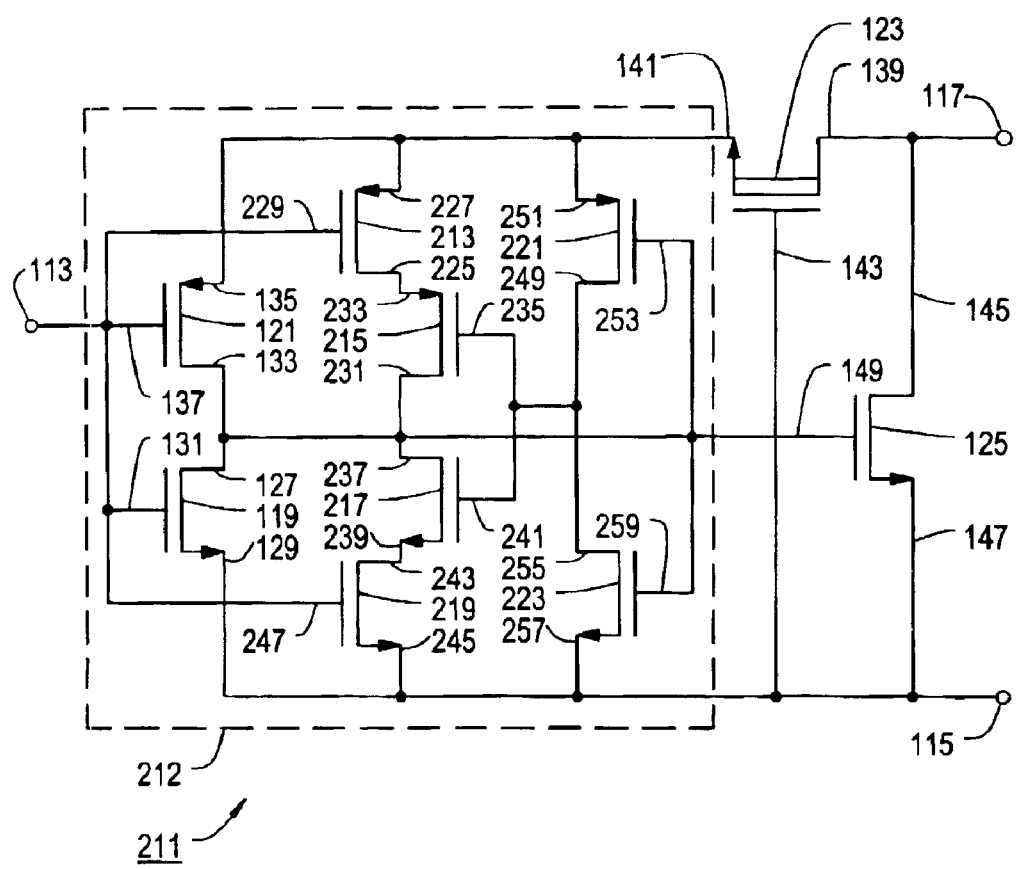
FIG. 5 is a schematic representation of a fourth embodiment of a three terminal, noninverting transistor switch constructed according to the teachings of the present invention.

Accordingly, referring now to FIG. 5, there is shown a fourth embodiment of a three terminal, noninverting, hysteretic, transistor switch constructed according to the teachings of the present invention, the switch being represented generally by reference numeral 211.

Switch 211 is similar in construction to switch 111 in that switch 211 comprises only three terminals. Specifically, switch 211 comprises first terminal 113, second terminal 115 and third terminal 117. Switch 211 is also similar in construction to switch 111 in that switch 211 comprises MOSFET 119, MOSFET 121, MOSFET 123 and MOSFET 125.

Switch 211 differs from switch 111 in that switch 211 comprises a CMOS inverter 212 which differs in construction from CMOS inverter 139 of switch 111. Specifically, CMOS inverter 212 is constructed to experience hysteresis whereas CMOS inverter 139 is not constructed to experience hysteresis.

CMOS inverter 212 comprises MOSFET 119, MOSFET 121, a P-channel, enhancement-mode, metal oxide semiconductor field effect transistor (MOSFET) 213, a P-channel, enhancement-mode, metal oxide semiconductor field effect transistor (MOSFET) 215, an N-channel, enhancement-mode, metal oxide semiconductor field effect transistor (MOSFET) 217, an N-channel, enhancement-mode, metal oxide semiconductor field effect transistor (MOSFET) 219, a P-channel, enhancement-mode, metal oxide semiconductor field effect transistor (MOSFET) 221 and an N-channel, enhancement-mode, metal oxide semiconductor field effect transistor (MOSFET) 223.

MOSFET 213 includes a drain 225, a source 227 connected to the source 141 of MOSFET 123 and a gate 229 connected to first terminal 113. MOSFET 215 includes a drain 231, a source 233 connected to the drain 225 of MOSFET 213 and a gate 235. MOSFET 217 includes a drain 237 connected to the drain 231 of MOSFET 215, a source 239 and a gate 241 connected to the gate 235 of MOSFET 215. MOSFET 219 includes a drain 243 connected to source 239 of MOSFET 217, a source 245 connected to second terminal 115 and a gate 247 connected to first terminal 113. MOSFET 221 includes a drain 249 connected to the gate 235 of MOSFET 215, a source 251 connected to the source 141 of MOSFET 123 and a gate 253 connected to the gate 149 of MOSFET 125. MOSFET 223 includes a drain 255 connected to the drain 249 of MOSFET 221, a source 257 connected to second terminal 115 and a gate 259 connected to the gate 149 of MOSFET 125.

CMOS inverter 212 of switch 211 can be fabricated using conventional CMOS fabrication technology. However, it is to be understood that CMOS inverter 212 differs slightly from a conventional CMOS inverter in that CMOS inverter 212 is connected to the remainder of the circuit in a nontraditional manner. Specifically, unlike a conventional CMOS inverter, the source 135 of CMOS inverter 212 is connected to the source 141 of MOSFET 123 rather than to an external positive power supply voltage.

It should be noted that the hysteretic CMOS inverter 212 of switch 211 could be replaced with alternative types of well-known hysteretic CMOS inverters without departing from the spirit of the present invention. As an example, it is well known in the art for one or more resistors to be used interchangeably with one or more MOSFETs.

Figure 6:
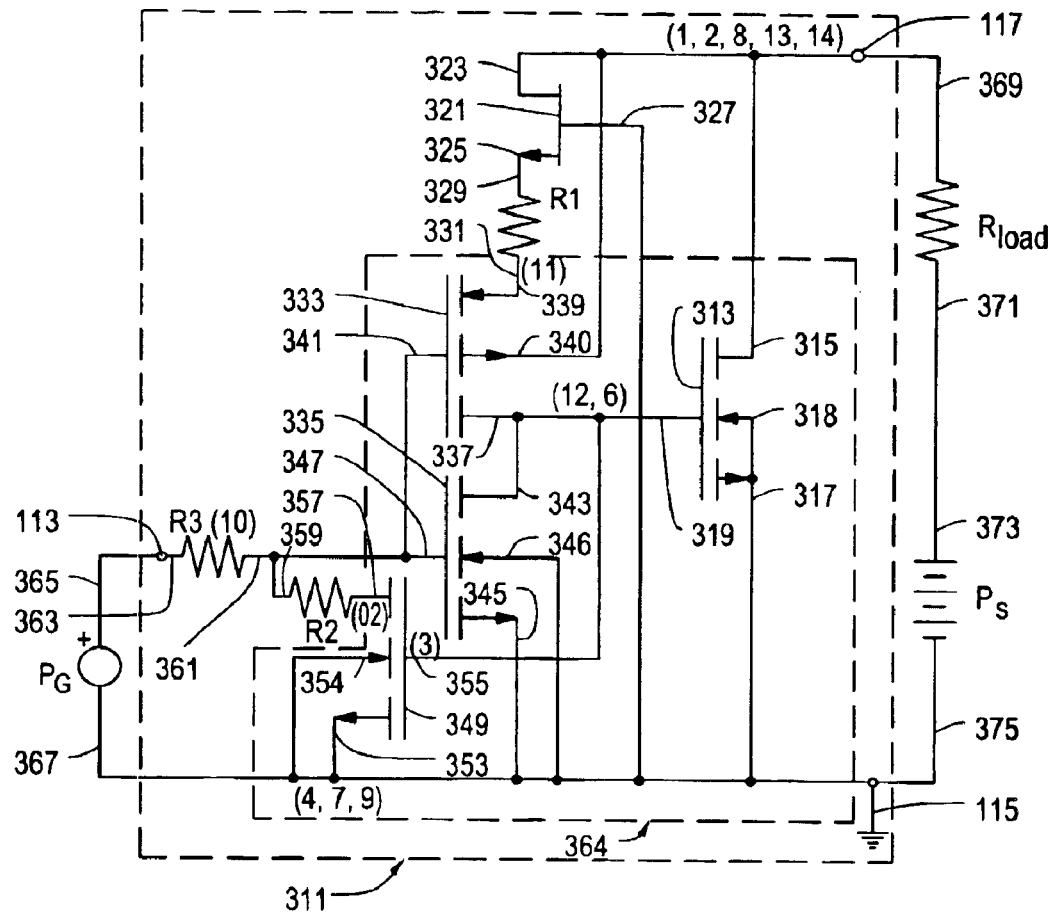
FIG. 6 is a schematic representation of a fifth embodiment of a three terminal, noninverting transistor switch constructed according to the teachings of the present invention, said transistor switch having been actually constructed and tested.

Referring now to FIG. 6, there is shown a fifth embodiment of a three terminal noninverting transistor switch constructed according to the teachings of the present invention, the switch being represented generally by reference numeral 311. As will be described further below, switch 311 functions similarly to switch 211 in that switch 311 experiences hysteresis.

It should be noted that switch 311 was actually built using commercially available electronic components. Furthermore, upon completion of construction, switch 311 was tested, the input voltage $V_{in}$ and the output voltage $V_{out}$ resulting from said testing being shown in FIG. 7. (The threshold voltage magnitudes and all signal voltages in switch 311 being approximately four or more times larger than those of ordinary practice. As a result, dividing all of the threshold and signal voltage magnitudes by four or more would produce a more useful switch.)

Switch 311 is similar in construction with switch 211 in that switch 311 comprises only three terminals. Specifically, switch 311 comprises a first terminal 113, a second terminal 115 and a third terminal 117. As can be appreciated, during the testing of switch 311, first terminal 113 served as the input voltage $V_{in}$ node, second terminal 115 served as the ground node and third terminal 117 served as the output voltage $V_{out}$ node.

Switch 311 comprises an N-channel, enhancement-mode, metal-oxide semiconductor field effect transistor (MOSFET) 313 which includes a drain 315 connected to third terminal 117, a source 317 connected to second terminal 115, a P-well 318 connected to the source 317 and a gate 319. As can be appreciated, MOSFET 313 functions similarly to MOSFET 125 in switch 211 in that MOSFET 311 serves as the primary switching device for switch 311.

Switch 311 comprises an N-channel, depletion-mode, junction field effect transistor (JFET) 321 which includes a drain 323 connected to third terminal 117, a source 325 and a gate 327 connected to second terminal 115. As can be appreciated, JFET 321 functions similarly to MOSFET 123 in that JFET 321 acts as a voltage stabilizer.

It should be noted that, during the actual construction of switch 311, transistor model number J108 was used for JFET 321. Due to the relatively high level of conductivity of JFET 321, a resistor R1 having a value of approximately 1 Mohm was connected to JFET 321 to limit the shoot-through current through JFET 321. Resistor R1 includes a first terminal 329 connected to the source 325 of JFET 321 and a second terminal 331.

Switch 311 comprises a P-channel, enhancement-mode, metal oxide semiconductor field effect transistor (MOSFET) 333 and an N-channel, enhancement-mode, metal oxide semiconductor field effect transistor (MOSFET) 335. As can be appreciated, MOSFETs 333 and 335 function similarly to MOSFETs 119 and 121 in that MOSFETs 333 and 335 together form a complementary metal oxide semiconductor (CMOS) inverter for switch 311.

MOSFET 333 comprises a drain 337 connected to the gate 319 of MOSFET 313, a source 339 connected to second terminal 331 of resistor R1, a substrate 340 connected to third terminal 117 and a gate 341. MOSFET 335 comprises a drain 343 connected to the drain 337 of MOSFET 333, a source 345 connected to second terminal 115, a P-well 346 connected to second terminal 115 and a gate 347 connected to the gate 341 of MOSFET 333.

Switch 311 further comprises an N-channel, enhancement-mode, metal oxide semiconductor field effect transistor (MOSFET) 349, a resistor R2 and a resistor R3. As can be appreciated, together MOSFET 349 and resistors R2 and R3 provide the hysteresis for switch 311.

MOSFET 349 comprises a drain 351, a source 353 connected to second terminal 115, a P-well 354 connected to second terminal 115 and a gate 355 connected to the gate 319 of MOSFET 313. Resistor R2 has a value of approximately 1 Mohm and includes a first terminal 357 connected to the drain 351 of MOSFET 349 and a second terminal 359 connected to the gate 347 of MOSFET 335. Resistor R3 has a value of approximately 2.2 Mohms and includes a first terminal 361 connected to the gate 347 of MOSFET 335 and a second terminal 363 connected to the first terminal 113.

It should be noted that, during the actual construction of switch 311, prior art integrated circuit (IC) chip model number CD4007 (which is a P-well CMOS integrated circuit array) was used to provide MOSFET 313, MOSFET 333, MOSFET 335 and MOSFET 349 for switch 211, said IC chip being represented in dashed form in FIG. 6 by reference numeral 364. As can be appreciated, the specific pin numbers for IC chip 364 are shown in parenthesis in FIG. 6.

Although a P-well CMOS IC chip 364 was utilized in the construction of switch 311, it is to be understood that an N-well CMOS IC chip could be used in place of chip 364 without departing from the spirit of the present invention. In fact, the use of an N-well CMOS IC chip in place of IC chip 364 would provide a number of significant advantages. As a first advantage, the use of an N-well CMOS IC chip in place of IC chip 364 would enable the N-well 340 of MOSFET 333 to be connected directly to source 339, thereby lowering the operating threshold of MOSFET 333, which is highly desirable. As a second advantage, the use of an N-well CMOS IC chip in place of IC chip 364 would allow for the N-well CMOS IC chip to be fabricated using multiple function IC fabrication technology (which is impermissible for a P-well CMOS IC chip), which is highly desirable. As a third advantage, the use of an N-well CMOS process could include the fabrication of N-channel, depletion-mode FET 321. Specifically, FET 321 can be provided, for instance, by adding another gate implant device, or different oxide thickness, to the N-well CMOS process. Also, because gate 327 of FET 321 is connected to pin 115 (which is the most negative node), FET 321 might be constructed as a JFET "well" device in the N-well CMOS process.

In order to test switch 311, a pulse generator $P_G$, a load resistor $R_{LOAD}$ and a power source $P_S$ are connected to switch 311. Specifically, pulse generator $P_G$ includes a first terminal 365 connected to first terminal 113 and a second terminal 367 connected to second terminal 115. Load resistor $R_{LOAD}$ has a value of approximately 100 Kohms and includes a first terminal 369 connected to third terminal 117 and a second terminal 371. Power source $P_S$ has a value of approximately 22 volts and includes a first terminal 373 connected to second terminal 371 of load resistor $R_{LOAD}$ and a second terminal 375 connected to second terminal 115.

Figure 7:
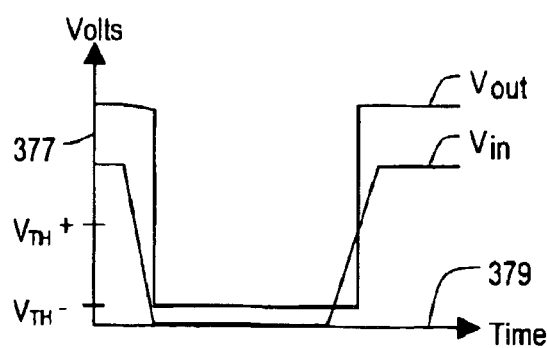
FIG. 7 is a graphical representation comparing an input voltage signal with an output voltage signal for the three terminal, noninverting transistor switch shown in FIG. 6.

FIG. 7 represents a graphical representation comparing the input voltage signal $V_{in}$ with the output voltage signal $V_{out}$ for the test switch 311 shown in FIG. 6, the graphical representation having a vertical axis 377 representing voltage and a horizontal axis 379 representing time. With the input voltage $V_{in}$ at first terminal 113 representing a trapezoidal wave and with the time at zero, input voltage $V_{in}$ is high (approximately 8 volts) which, in turn, produces a logic high value (approximately 22 volts) for the output voltage $V_{out}$ at third terminal 117.

As input voltage $V_{in}$ slowly decreases, once input voltage $V_{in}$ equals the falling threshold voltage $V_{TH-}$ (approximately 1.6 volts), MOSFET 335 will turn off and MOSFET 333 will turn on. As a result, the current passing through JFET 321 passes entirely through MOSFET 333 and into the gate 319 of MOSFET 313. The passing of current into gate 319, in turn, results in the high conductance between drain 315 and source 317 of MOSFET 313, thereby producing a logic low output signal voltage $V_{out}$ (approximately 2.5 volts).

Output voltage $V_{out}$ remains at its logic low value, until input voltage $V_{in}$ increases. As input voltage $V_{in}$ increases, eventually MOSFET 335 will turn on and MOSFET 333 will turn off once the input voltage $V_{in}$ equals the rising threshold voltage $V_{TH+}$ (approximately 5.2 volts). Because MOSFET 333 is off, the voltage at source 339, resistor R1 and source 325 rises to as high as approximately 6 volts, which is the pinch-off voltage of JFET 321. Because MOSFET 335 turns on, drain 343 connects gate 319 of MOSFET 313 via source 345 to second terminal 115, resulting in low voltage at gate 319 and low conductance between drain 315 and source 317 of MOSFET 313, thereby producing a logic high output signal voltage $V_{out}$ (approximately 22 volts). Furthermore, it should be noted that, with MOSFET 333 turned off, the CMOS inverter for switch 311 serves to minimize the amount of current leakage (approximately a few microamps) between third terminal 117 and second terminal 115, which is a principal object of the present invention.

It should be noted that rising threshold voltage $V_{TH+}$ (approximately 5.2 volts) is significantly higher than the falling threshold voltage $V_{TH-}$ (approximately 1.6 volts), as seen clearly in FIG. 5. Because switch 311 experiences hysteresis, a noisy input voltage signal $V_{in}$ will not cause switch 311 to experience unwanted state changes, which is highly desirable.

As noted briefly above, the three terminal, noninverting transistor switches of the present invention have many potential applications. As an example of one potential application, each of the transistor switches of the present invention may be used as a supervisory switch for monitoring one or more power supplies in microprocessor and digital systems. In this capacity, each transistor switch asserts a reset signal whenever any of the power supplies declines below a preset threshold, as will be described further in detail below.

Figure 8:
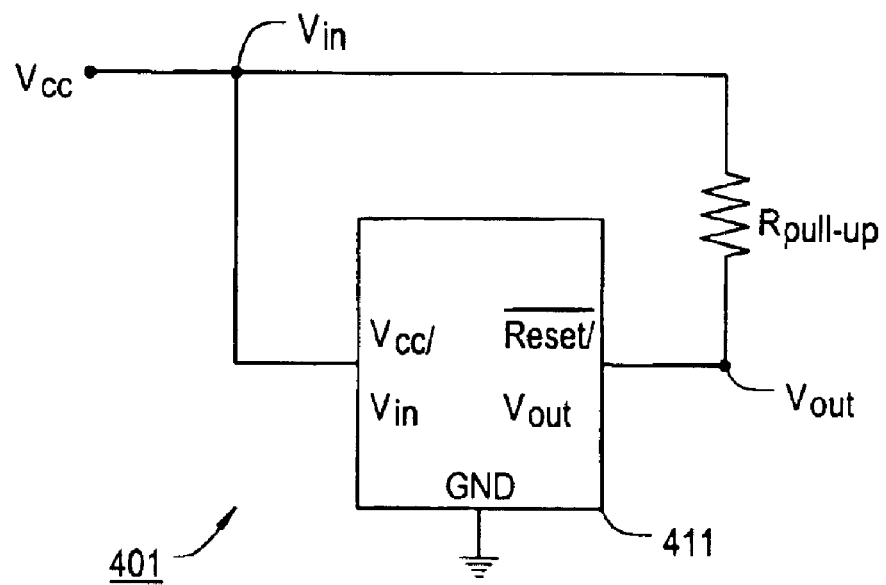
FIG. 8 is a schematic representation of an operating circuit in which a prior art, three terminal, noninverting, microprocessor reset circuit is connected to single power source and a pull-up resistor.

Referring now to FIG. 8, there is shown a schematic representation of an operating circuit, said operating circuit being identified generally by reference numeral 401.

Operating circuit 401 includes a three terminal, noninverting microprocessor reset circuit which is manufactured by Maxim® Integrated Products and sold under product number MAX809, said microprocessor reset circuit being identified herein by reference numeral 411. It should be noted that microprocessor reset circuit 411 represents a wide range of similar circuits which function improperly by failing to hold a pull-up resistor low upon the application of a very low input voltage. The wide range of similar circuits noted above are often referred to, inter alia, as "power good" circuits, voltage detectors, reset circuits and microprocessor supervisors, said circuits being commonly used to detect turn-on, turn-off, low line (brown out) or other similar conditions. As will be described further in detail below, the switches of the present invention can be used to prevent an improper "reset" or "voltage good" output from microprocessor reset circuit 411 during an arbitrary low power supply condition.

Microprocessor reset circuit 411 includes an input voltage pin Vin which is connected to a power source Vcc (e.g., 5 volts), a ground pin GND which is connected to ground and an output voltage pin Vout. A pull-up resistor $R_{PULL-UP}$ is connected at one end to output voltage pin Vout and is connected at its other end to power source Vcc.

Figure 9:
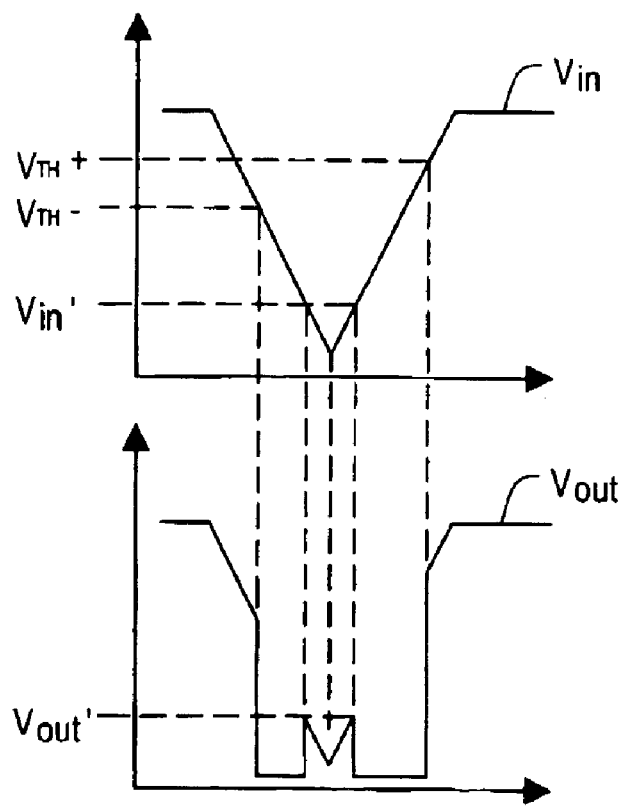
FIG. 9 is a pair of graphical representations which compare an input voltage signal with an output voltage signal for the operating circuit shown in FIG. 8.

In use, microprocessor reset circuit 411 can be used to monitor the voltage of power source Vcc. FIG. 9 represents a pair of graphical representations which compare the input voltage signal $V_{in}$ (which is equal to the voltage of power source Vcc) with the output voltage signal $V_{out}$ of operating circuit 401. With the input voltage $V_{in}$ representing a triangular wave and with the time at zero, input voltage $V_{in}$ is high (approximately 5 volts) which, in turn, produces a logic high value (approximately 5 volts) for the output voltage $V_{out}$.

As input voltage $V_{in}$ slowly decreases, current through pull-up resistor $R_{PULL-UP}$ slowly decreases output voltage $V_{out}$ in such a manner so that output voltage $V_{out}$ follows input voltage $V_{in}$. Once input voltage $V_{in}$ equals the falling threshold voltage $V_{TH-}$, microprocessor reset circuit 411 drops the output voltage $V_{out}$ to approximately zero. Furthermore, as input voltage $V_{in}$ slowly increases, once input voltage $V_{in}$ equals the rising threshold voltage $V_{TH+}$, microprocessor reset circuit 411 raises the output voltage $V_{out}$ back to its logic high value of approximately 5 volts.

However, it should be noted that microprocessor reset circuit 411 functions improperly as the input voltage $V_{in}$ approaches zero. Specifically, when the input voltage $V_{in}$ equals an intermediate input voltage value $V_{in'}$, microprocessor reset circuit 411 produces an false output voltage $V_{out'}$ of less than approximately 1 volt. Although the value of output voltage $V_{out'}$ is invalid, the particular value of the false output voltage $V_{out'}$ remains a valid logic low value, thereby precluding microprocessor reset circuit 411 from determining that the voltage of power supply Vcc is high and, accordingly, asserting a reset signal for circuit 401.

Figure 10:
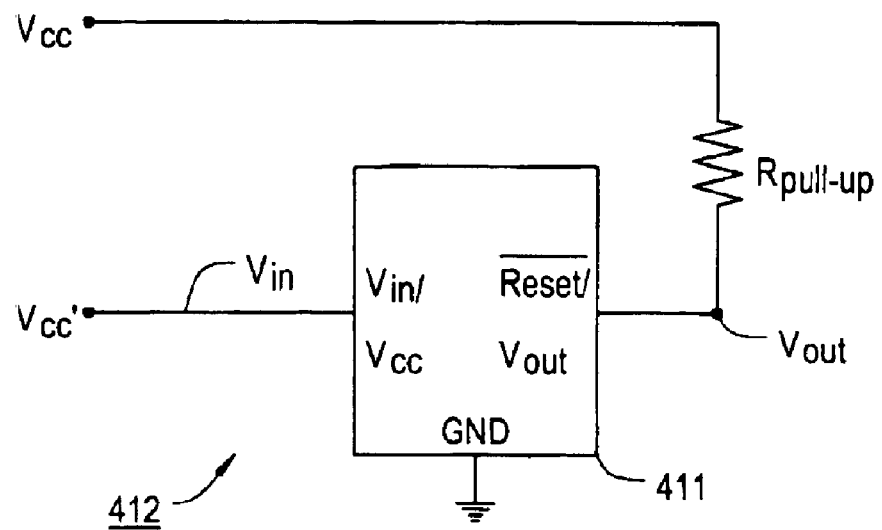
FIG. 10 a schematic representation of an operating circuit in which the prior art, three terminal, noninverting, microprocessor reset circuit shown in FIG. 8 is connected to a pair of power sources and a pull-up resistor.

Referring now to FIG. 10, there is shown a schematic representation of an operating circuit, said operating circuit being identified generally by reference numeral 412.

Operating circuit 412 includes microprocessor reset circuit 411. Operating circuit 412 differs from operating circuit 401 in that, in operating circuit 412, microprocessor reset circuit 411 is used to monitor the voltage of a second power source Vcc' (e.g., having a variable 3.3 DC voltage) in addition to power source Vcc (e.g., having a fixed 5.0 DC voltage).

Microprocessor reset circuit 411 includes an input voltage pin Vin which is connected to the second power source Vcc', a ground pin GND which is connected to ground and an output voltage pin Vout. A pull-up resistor $R_{PULL-UP}$ is connected at one end to the output voltage pin Vout of microprocessor reset circuit 411 and is connected at its other end to the first power source Vcc.

Figure 11:
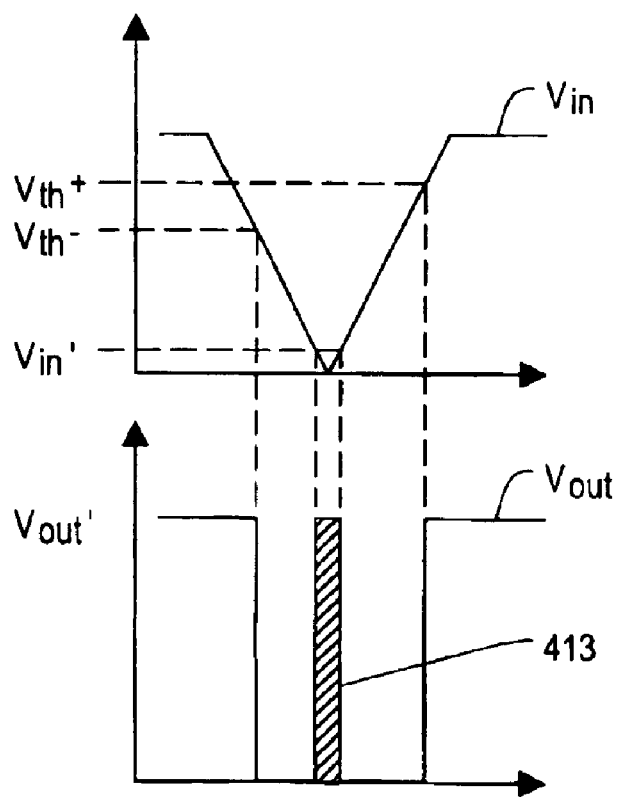
FIG. 11 is a pair of graphical representations which compare an input voltage signal with an output voltage signal for the operating circuit shown in FIG. 10.

In use, microprocessor reset circuit 411 can be used to monitor the voltage of power source Vcc'. FIG. 11 represents a pair of graphical representations which compare the input voltage signal $V_{in}$ (which is equal to power source Vcc') with the output voltage signal $V_{out}$ of operating circuit 412. As seen in FIG. 11, microprocessor reset circuit 411 functions differently in operating circuit 412 than in operating circuit 401. Specifically, when the input voltage $V_{in}$ is equal to or less than the intermediate input voltage value $V_{in'}$, microprocessor reset circuit 411 produces a false output voltage $V_{out'}$ of approximately 5 volts, as shown by dashed region 413 in FIG. 11. As can be appreciated, the particular value of the output voltage $V_{out'}$ produced within region 413 is a logic high value. As a result, microprocessor reset circuit 411 provides a logic high value for the output voltage $V_{out'}$ and asserts an improper reset signal for operating circuit 412, which is highly undesirable.

Figure 12:
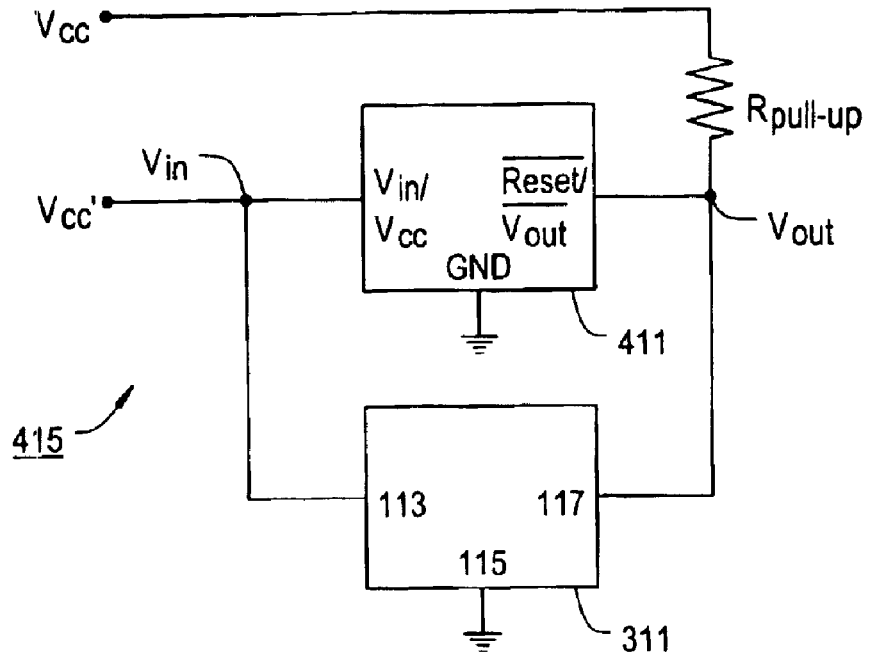
FIG. 12 is a schematic representation of an operating circuit in which the three terminal, noninverting transistor switch shown in FIG. 6 and the a prior art three terminal, noninverting, microprocessor reset circuit shown in FIG. 10 are connected to a pair of power sources and a pull-up resistor.
Figure 13:
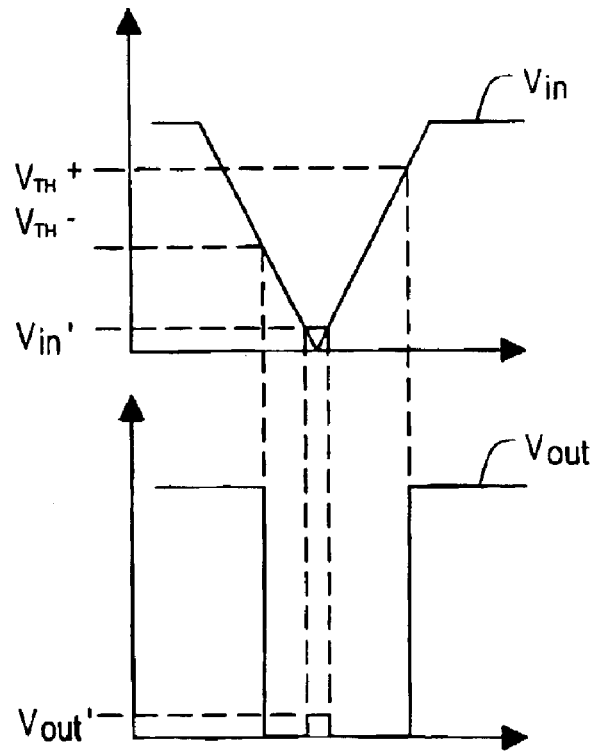
FIG. 13 is a pair of graphical representations which compare an input voltage signal with an output voltage signal for the operating circuit shown in FIG. 12.

Referring now to FIG. 12, there is shown a schematic representation of an operating circuit, said operating circuit being identified generally by reference numeral 415.

Operating circuit 415 is identical to operating circuit 412 except operating circuit 415 additionally comprises one of the three terminal, noninverting transistor switches of the present invention. As will be described further below, the use of one of the three terminal, noninverting transistor switches of the present invention in operating circuit 415 serves to lower the output voltage $V_{out'}$ produced by operating circuit 412 during region 413 to a logic low value, which is highly desirable.

For simplicity purposes only, switch 311 is shown in operating circuit 415. However, it should be noted that, in order to utilize switch 311 in operating circuit 415, the threshold voltages of JFET 321, MOSFET 333 and MOSFET 335 require considerable reduction (e.g., the threshold voltage of JFET 321 being reduced to 2 volts and the threshold voltages of MOSFETs 333 and 335 being reduced to ½ volt). Furthermore, although operating circuit 415 is shown herein comprising transistor switch 311, it is to be understood that transistor switch 311 could be replaced by either transistor switch 111, transistor switch 151, transistor switch 161 or transistor switch 211 without departing from the spirit of the present invention.

Microprocessor reset circuit 411 includes an input voltage pin Vin which is connected to second power source Vcc', a ground pin GND which is connected to ground and an output voltage pin Vout. A pull-up resistor $R_{PULL-UP}$ is connected at one end to output voltage pin Vout of circuit 411 and is connected at its other end to power source Vcc.

Furthermore, first terminal 113 of transistor switch 311 is connected to the input voltage pin Vin of circuit 411, second terminal 115 of transistor switch 311 is connected to ground, and third terminal 117 of transistor switch 311 is connected the output voltage pin Vout of circuit 411. Switch 311 serves to remedy the malfunction of IC 411 in the following manner. Specifically, as input voltage $V_{in}$ (which equals second power source Vcc') approaches zero, once input voltage $V_{in}$ reaches $V_{in'}$, IC 411 temporarily produces an false high output voltage $V_{out'}$. However, switch 311 serves to reduce the value of output voltage $V_{out'}$ to a logic low value, thereby precluding IC 411 from inadvertently resetting the system.

In use, transistor switch 311 and microprocessor reset circuit 411 can be used to monitor the voltage of power sources Vcc and Vcc'. FIG. 12 represents a pair of graphical representations which compare the input voltage signal $V_{in}$ with the output voltage signal $V_{out}$ of operating circuit 415. As seen in FIG. 11, transistor switch 311 remedies the shortcoming of microprocessor reset circuit 411 which was identified above in conjunction with operating circuit 412. Specifically, when the input voltage $V_{in}$ (which equals second power source Vcc') is equal to or less than the intermediate input voltage value $V_{in'}$, transistor switch 311 lowers the value of the false output voltage $V_{out'}$ produced by microprocessor reset circuit 411. In fact, transistor switch 311 lowers the value of the false output voltage $V_{out'}$ to a logic low value, thereby precluding microprocessor reset circuit 411 from incorrectly asserting a reset signal for operating circuit 415.

The embodiments of the present invention described above are intended to be merely exemplary and those skilled in the art shall be able to make numerous variations and modifications to it without departing from the spirit of the present invention. For example, the scope of the present invention also includes three terminal noninverting transistor switches that use a "fourth" pin (power supply) for normal operation (and potentially even for enhancement purposes) but still operate (for example as a "fail-safe" feature) without power applied to this "fourth" power pin. All such variations and modifications are intended to be within the scope of the present invention as defined in the appended claims.

What is claimed is:

1. A noninverting transistor switch having only three terminals, said three terminals being a first terminal, a second terminal and a third terminal, said noninverting transistor switch comprising:
   (a) a transistor connected to the second and third terminals, said transistor having an on switching state in which current is able pass between the second and third terminals and an off switching state in which current is interrupted from passing between the second and third terminals,
   (b) a voltage stabilizer connected to the second and third terminals, and
   (c) a complementary metal oxide semiconductor (CMOS) inverter connected to the first terminal, the second terminal, said transistor and said voltage stabilizer, said CMOS inverter interrupting the passing of current between said voltage stabilizer and the second terminal when said transistor is in its off switching state.

2. The switch as claimed in claim 1 wherein said voltage stabilizer supplies the voltage to said CMOS inverter.

3. The switch as claimed in claim 1 wherein said transistor is in the form of a first field effect transistor (FET), said first FET including a drain, a source and a gate, the drain of said first FET being connected to the third terminal and the source of said first FET being connected to the second terminal.

4. The switch as claimed in claim 3 wherein said first FET is an N-channel, enhancement-mode metal oxide semiconductor field effect transistor (MOSFET).

5. The switch as claimed in claim 3 wherein said voltage stabilizer is in the form of a second field effect transistor (FET), said second FET including a drain, a source and a gate, the drain of said second FET being connected to the third terminal, the source of said second FET being connected to said CMOS inverter and the gate of said second FET being connected to the second terminal.

6. The switch as claimed in claim 5 wherein said second FET is an N-channel depletion-mode, metal oxide semiconductor field effect transistor (MOSFET).

7. The switch as claimed in claim 5 wherein said CMOS inverter is connected to the first terminal, the second terminal, the gate of said first FET, and the source of said second FET.

8. The switch as claimed in claim 7 wherein said CMOS inverter comprises:
   a. a third field effect transistor (FET), said third FET including a drain, a source and a gate, the drain of said third FET being connected to the gate of said first FET, the source of said third FET being connected to the second terminal and the gate of said third FET being connected to the first terminal; and
   b. a fourth field effect transistor (FET), said fourth FET including a drain, a source and a gate, the drain of said fourth FET being connected to the gate of said first FET, the source of said fourth FET being connected to the source of said second FET and the gate of said fourth FET being connected to the first terminal.

9. The switch as claimed in claim 8 wherein said third FET is an N-channel enhancement-mode, metal oxide semiconductor field effect transistor(MOSFET) and said fourth FET is a P-channel enhancement-mode, metal oxide semiconductor field effect transistor (MOSFET).

10. The switch as claimed in claim 8 wherein said switch experiences hysteresis.

11. The switch as claimed in claim 8 wherein said CMOS inverter further comprises:
   (a) a fifth field effect transistor (FET), said fifth FET including a drain, a source and a gate, the source of said fifth FET being connected to the source of said second FET, the gate of said fifth FET being connected to the first terminal;
   (b) a sixth field effect transistor (FET), said sixth FET including a drain, a source and a gate, the drain of said sixth FET being connected to the drain of said third FET, the source of said sixth FET being connected to the drain of said fifth FET;
   (c) a seventh field effect transistor (FET), said seventh FET including a drain, a source and a gate, the drain of said seventh FET being connected to the drain of said sixth FET, the gate of said seventh FET being connected to the gate of said sixth FET;
   (d) an eighth field effect transistor (FET), said eighth FET including a drain, a source and a gate, the drain of said eighth FET being connected to the source of said seventh FET, the source of said eighth FET being connected to the second terminal, the gate of said eighth FET being connected to the first terminal;
   (e) a ninth field effect transistor (FET), said ninth FET including a drain, a source and a gate, the drain of said ninth FET being connected to the gate of said sixth FET, the source of said ninth FET being connected to the source of said second FET, the gate of said ninth FET being connected to the gate of said first FET; and
   (f) a tenth field effect transistor (FET), said tenth FET including a drain, a source and a gate, the drain of said tenth FET being connected to the drain of said ninth FET, the source of said tenth FET being connected to the second terminal, the gate of said tenth FET being connected to the gate of said ninth FET.

12. A noninverting transistor switch having only three terminals, said three terminals being a first terminal, a second terminal and a third terminal, said noninverting transistor switch comprising:
   (a) a first transistor including a drain, a source and a gate, the drain of said first transistor being connected to the third terminal and the source of said first transistor being connected to the second terminal,
   (b) a second transistor including a drain, a source and a gate, the drain of said second transistor being connected to the third terminal and the gate of said second transistor being connected to the second terminal,
   (c) a third transistor including a drain, a source and a gate, the drain of said third transistor being connected to the gate of said first transistor, the source of said third transistor being connected to the second terminal and the gate of said third transistor being connected to the first terminal, and
   (d) a fourth transistor including a drain, a source and a gate, the drain of said fourth transistor being connected to the gate of said first transistor, the source of said fourth transistor being connected to the source of said second transistor and the gate of said fourth transistor being connected to the first terminal.

13. The switch as claimed in claim 12 wherein said first transistor is an N-channel, enhancement-mode metal oxide semiconductor field effect transistor (MOSFET).

14. The switch as claimed in claim 13 wherein said second transistor is an N-channel depletion-mode, metal oxide semiconductor field effect transistor (MOSFET).

15. The switch as claimed in claim 14 wherein said third transistor is an N-channel enhancement-mode, metal oxide semiconductor field effect transistor (MOSFET) and said fourth transistor is a P-channel enhancement-mode, metal oxide semiconductor field effect transistor (MOSFET).

16. The switch as claimed in claim 15 wherein said switch experiences hysteresis.

17. The switch as claimed in claim 16 further comprising:
   (a) a fifth transistor including a drain, a source and a gate, the source of said fifth transistor being connected to the source of said second transistor, the gate of said fifth transistor being connected to the first terminal,
   (b) a sixth transistor including a drain, a source and a gate, the drain of said sixth transistor being connected to the drain of said third transistor, the source of said sixth transistor being connected to the drain of said fifth transistor;
   (c) a seventh transistor including a drain, a source and a gate, the drain of said seventh transistor being connected to the drain of said sixth transistor, the gate of said seventh transistor being connected to the gate of said sixth transistor;

(d) an eighth transistor, said eighth transistor including a drain, a source and a gate, the drain of said eighth transistor being connected to the source of said seventh transistor, the source of said eighth transistor being connected to the second terminal, the gate of said eighth transistor being connected to the first terminal;

(e) a ninth transistor including a drain, a source and a gate, the drain of said ninth transistor being connected to the gate of said sixth transistor, the source of said ninth transistor being connected to the source of said second transistor, the gate of said ninth transistor being connected to the gate of said first transistor; and (f) a tenth transistor including a drain, a source and a gate, the drain of said tenth transistor being connected to the drain of said ninth transistor, the source of said tenth transistor being connected to the second terminal, the gate of said tenth transistor being connected to the gate of said ninth transistor.

18. A noninverting transistor switch having only three terminals, said three terminals being a first terminal, a second terminal and a third terminal, said noninverting transistor switch comprising:

(a) a first transistor including a drain, a source and a gate, the drain of said first transistor being connected to the third terminal and the source of said first transistor being connected to the second terminal, (b) a second transistor including a drain, a source and a gate, the drain of said second transistor being connected to the third terminal and the gate of said second transistor being connected to the second terminal, (c) a third transistor including a drain, a source and a gate, the drain of said third transistor being connected to the gate of said first transistor, the source of said third transistor being connected to the second terminal and the gate of said third transistor being connected to the source of said second transistor, and (d) a fourth transistor including a drain, a source and a gate, the drain of said fourth transistor being connected to the gate of said first transistor, the source of said fourth transistor being connected to the source of said second transistor and the gate of said fourth transistor being connected to the first terminal.

19. A noninverting transistor switch having only three terminals, said three terminals being a first terminal, a second terminal and a third terminal, said noninverting transistor switch comprising:

(a) a first transistor including a drain, a source and a gate, the drain of said first transistor being connected to the third terminal and the source of said first transistor being connected to the second terminal, (b) a second transistor including a drain, a source and a gate, the drain of said second transistor being connected to the third terminal and the gate of said second transistor being connected to the second terminal, (c) a third transistor including a drain, a source and a gate, the drain of said third transistor being connected to the gate of said first transistor, the source of said third transistor being connected to the source of said second transistor and the gate of said third transistor being connected to the first terminal, and (d) a resistor having a first terminal and a second terminal, the first terminal of said resistor being connected to the drain of said third transistor, the second terminal of said resistor being connected to the gate of said second transistor.

* * * * *